US012219864B2

(12) United States Patent
Yug

(10) Patent No.: US 12,219,864 B2
(45) Date of Patent: Feb. 4, 2025

(54) METHOD OF MANUFACTURING A DISPLAY DEVICE

(71) Applicant: Samsung Display Co., Ltd., Yongin-si (KR)

(72) Inventor: Geunwoo Yug, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 447 days.

(21) Appl. No.: 17/546,671

(22) Filed: Dec. 9, 2021

(65) Prior Publication Data

US 2022/0302424 A1 Sep. 22, 2022

(30) Foreign Application Priority Data

Mar. 17, 2021 (KR) .................. 10-2021-0034661

(51) Int. Cl.
| | |
|---|---|
| *H10K 71/00* | (2023.01) |
| *B23K 26/38* | (2014.01) |
| *B23K 26/402* | (2014.01) |
| *H10K 71/80* | (2023.01) |
| *H10K 77/10* | (2023.01) |
| *H10K 102/00* | (2023.01) |

(52) U.S. Cl.
CPC ............ *H10K 71/00* (2023.02); *B23K 26/38* (2013.01); *B23K 26/402* (2013.01); *H10K 71/80* (2023.02); *H10K 77/111* (2023.02); *H10K 2102/311* (2023.02)

(58) Field of Classification Search
CPC .............................. H10K 71/00; H10K 71/80
See application file for complete search history.

(56) References Cited

U.S. PATENT DOCUMENTS

| | | | | |
|---|---|---|---|---|
| 9,673,014 | B2* | 6/2017 | Kim | H01J 9/00 |
| 2007/0153219 | A1 | 7/2007 | Kim | |
| 2014/0323006 | A1* | 10/2014 | Song | H10K 50/84 |
| | | | | 445/24 |
| 2017/0197868 | A1* | 7/2017 | Gupta | B23K 26/0624 |
| 2018/0166652 | A1* | 6/2018 | Kim | H10K 59/8722 |

FOREIGN PATENT DOCUMENTS

| | | |
|---|---|---|
| KR | 10-0514095 | 11/2005 |
| KR | 10-0972488 | 7/2010 |
| KR | 10-1149099 | 5/2012 |
| KR | 10-1399838 | 5/2014 |
| KR | 10-2012297 | 8/2019 |
| WO | WO2016046997 | * 3/2016 |

* cited by examiner

Primary Examiner — Edmund H Lee
(74) Attorney, Agent, or Firm — KILE PARK REED & HOUTTEMAN PLLC

(57) ABSTRACT

A manufacturing method of a display device includes providing a work panel including a display panel including a folding area, and a carrier film disposed under the display panel and including a first area and a second area, wherein a peeling tape is attached to the first area and the second area is adjacent to the first area, and cutting the work panel by irradiating a laser beam on to the work panel. The cutting of the work panel includes irradiating the laser beam along a first cutting line corresponding to the first area under a first condition, and irradiating the laser beam along a second cutting line corresponding to the second area under a second condition different from the first condition.

15 Claims, 14 Drawing Sheets

METHOD OF MANUFACTURING A DISPLAY DEVICE

CROSS-REFERENCE TO RELATED APPLICATION(S)

This application claims priority to and benefits of Korean Patent Application No. 10-2021-0034661 under 35 U.S.C. § 119, filed on Mar. 17, 2021, in the Korean Intellectual Property Office, the entire contents of which are incorporated herein by reference.

BACKGROUND

1. Technical Field

The disclosure relates to a display device and a method of manufacturing the same. The display device improves process reliability and a method of manufacturing such a display device is disclosed.

2. Description of the Related Art

A display device includes a display panel displaying an image and a variety of optical members or a window disposed on the display panel. The display device is manufactured through various processes. To prevent the display panel from being damaged during a process of forming the display panel or a process of attaching the optical members or the window to the display panel, processes are performed on the display panel after a carrier film is attached to the display panel. The carrier film is removed from the display panel before the display panel is shipped as a product.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that may be capable of improving a process reliability in a process of removing a carrier film.

The disclosure provides a method of manufacturing the display device that may simplify processes, improve process reliability, and reduce process costs.

In the embodiments, a method of manufacturing a display device may include providing a work panel including a display panel and a carrier film disposed under the display panel, and cutting the work panel irradiating a laser beam on to the work panel. The display panel may include a folding area. The carrier film may include a first area and a second area, wherein a peeling tape is attached to the first area and the second area is adjacent to the first area. The cutting of the work panel may include irradiating the laser beam along a first cutting line corresponding to the first area under a first condition, and irradiating the laser beam along a second cutting line corresponding to the second area under a second condition, the second condition being different from the first condition.

The first condition may be different from the second condition in at least one of a speed, a power, a frequency, and a pulse width of the laser beam.

The laser beam may be irradiated at a first speed under the first condition. The laser beam may be irradiated at a second speed faster than the first speed under the second condition.

The first speed may be equal to or greater than about 1 mm/s and equal to or less than about 300 mm/s.

The cutting of the work panel may include irradiating the laser beam along the first cutting line and the second cutting line above a rear surface of the work panel.

The method may include attaching the peeling tape to the first area, and removing the carrier film from the display panel after the cutting of the work panel.

The first cutting line has a length equal to or greater than about 1.0 cm and equal to or less than about 1.5 cm.

A first side surface may be formed in the work panel by the irradiating of the laser beam under the first condition. The first side surface may include a first sub-side surface corresponding to the carrier film and a second sub-side surface disposed on the first sub-side surface. The second sub-side surface may include an inclined surface inclined at an angle with respect to the first sub-side surface.

The angle between the first sub-side surface and the inclined surface may be equal to or greater than about 100° and equal to or less than about 150°.

The inclined surface may be a convex inclined surface protruded from the first side surface.

A second side surface may be formed in the work panel by the irradiating of the laser beam under the second condition. The second side surface may include a third sub-side surface overlapping the carrier film, and a fourth sub-side surface overlapping the display panel. An angle between the third sub-side surface and the fourth sub-side surface may be equal to or greater than about 170° and equal to or less than about 180°.

In the embodiments, a method of manufacturing a display device may include providing a work panel including a display panel including a folding area and a carrier film disposed under the display panel, and cutting the work panel by irradiating a laser beam on to the work panel. The carrier film may include a first area and a second area, wherein a peeling tape is attached to the first area and a second area is adjacent to the first area. The cutting of the work panel may include irradiating the laser beam along a first cutting line corresponding to the first area under a first condition to form a first side surface in the work panel and irradiating the laser beam along a second cutting line corresponding to the second area under a second condition different from the first condition. The first side surface may include a first sub-side surface corresponding to the carrier film and including a flat surface, and a second sub-side surface including an inclined surface adjacent to the first sub-side surface and inclined at a first angle with respect to the flat surface.

The first condition may be different from the second condition in at least one of a speed, a power, a frequency, and a pulse width of the laser beam.

The laser beam may be irradiated at a first speed under the first condition. The laser beam may be irradiated at a second speed faster than the first speed under the second condition.

The first angle is equal to or greater than about 100° and equal to or less than about 150°.

In the embodiments a display device may include a display panel including short sides extending in a first direction and long sides extending in a second direction intersecting the first direction, and a protective layer disposed under the display panel. The display panel may include at least one curved portion corresponding to a portion where the long sides meet the short sides, the at least one curved portion having a round shape with a predetermined curvature and a straight portion adjacent to the at least one curved portion. The protective layer may include a first protective portion corresponding to the at least one curved portion and a second protective portion corresponding to the straight portion. A side surface of the first protective portion may include an inclined surface inclined at an angle equal to or greater than about 100° and equal to or less than about 150° with respect to a reference surface substantially parallel to a third direction intersecting the first direction and the second direction. A side surface of the second protective portion may be inclined at an angle equal to or greater than about 170° and equal to or less than about 180° with respect to the reference surface.

The side surface of the first protective portion has a length greater than a length of the side surface of the second protective portion.

The at least one curved portion may be provided in plural. The first protective portion of the protective layer may correspond to at least one of the plurality of curved portions.

An angle between a lower surface of the first protective portion and the inclined surface may be equal to or greater than about 10° and equal to or less than about 60°.

The inclined surface may be a convex inclined surface protruded from the reference surface.

According to the embodiments, the carrier film may be easily removed, and process reliability during manufacture may be improved. Since the display module may be formed without additional processes, product manufacturing time and process costs may be reduced.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
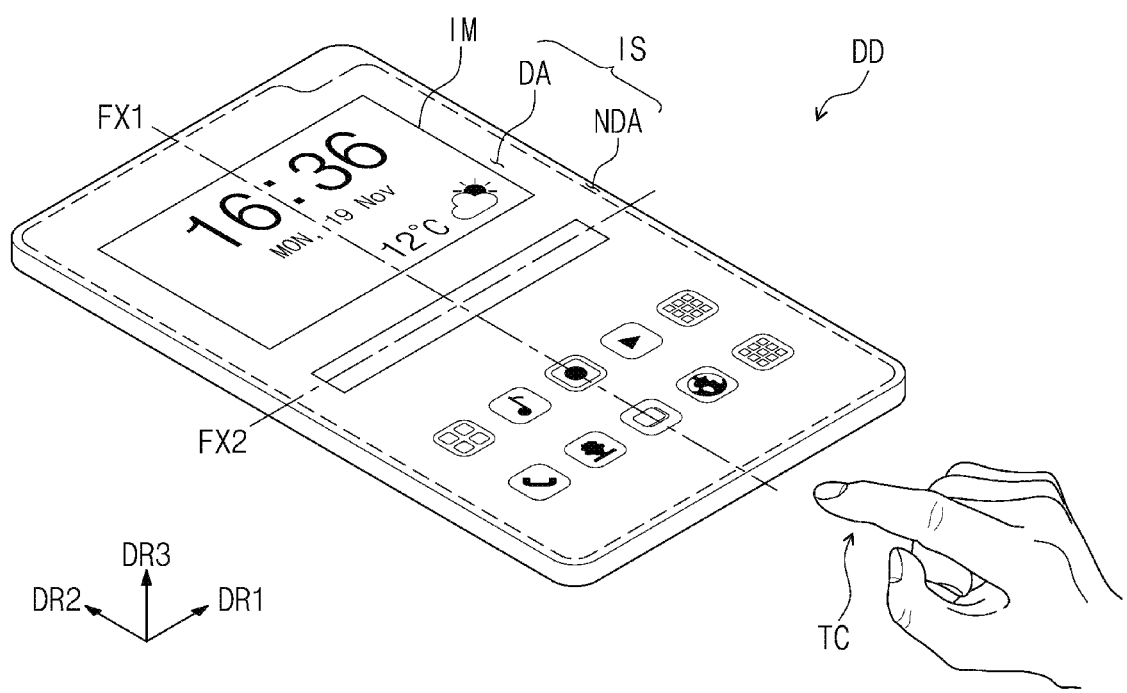
FIG. 1 is a schematic perspective view showing a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, it will be understood that when an element or layer is referred to as being "on", "connected to" or "coupled to" another element or layer, it can be directly on, connected or coupled to the other element or layer or intervening elements or layers may be.

When an element is referred to as being "disposed directly" to another element, there are no intervening elements between a layer, film region, or substrate and another layer, film, region, or substrate. For example, the term "disposed directly" may mean that two layers or two members are disposed without employing additional adhesive members therebetween.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, the disclosure will be explained in detail with reference to the accompanying drawings.

Figure 2A:
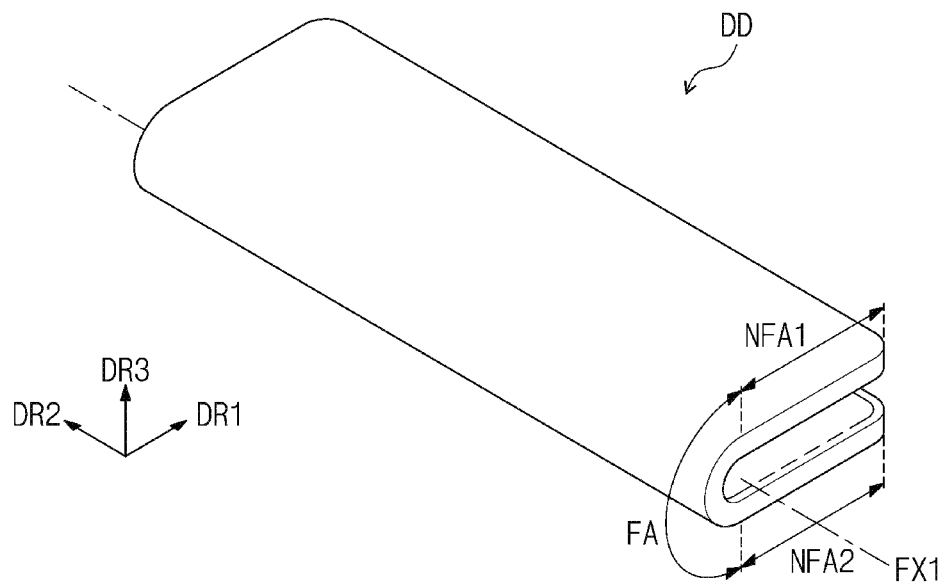
FIG. 2A is a schematic perspective view showing a state in which the display device shown in FIG. 1 is inwardly folded (in-folding) about a first folding axis.
Figure 2B:
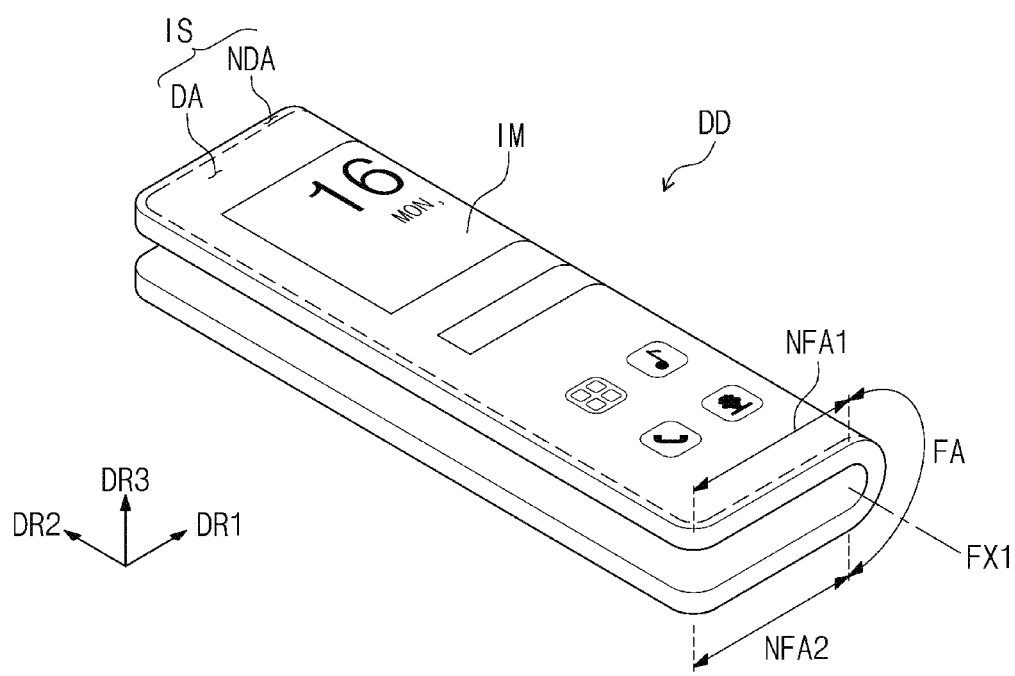
FIG. 2B is a schematic perspective view showing a state in which the display device shown in FIG. 1 is outwardly folded (out-folding) about the first folding axis.

FIG. 1 is a schematic perspective view showing a display device DD according to an embodiment of the disclosure. FIGS. 2A and 2B are schematic perspective views showing folding states of the display device DD shown in FIG. 1.

Referring to FIG. 1, the display device DD may have a rectangular shape with short sides substantially parallel to a first direction DR1 and long sides substantially parallel to a second direction DR2 intersecting the first direction DR1. However, the shape of the display device DD should not be limited to a rectangular shape, and the display device DD may have a variety of shapes.

The display device DD may be a foldable display device. In detail, the display device DD according to an embodiment of the disclosure may be folded about folding axes FX1 and FX2. Hereinafter, a state in which the display device DD is folded about the folding axes FX1 and FX2 is referred to as a folded state, and a state in which the display device DD is not folded is referred to as an unfolded state. The folding axes FX1 and FX2 may be rotational axes generated when the display device DD is folded.

The folding axes FX1 and FX2 may extend in the first direction DR1 or the second direction DR2. According to an embodiment of the disclosure, the folding axis extending in the second direction DR2 is referred to as a first folding axis FX1, and the folding axis extending in the first direction DR1 is referred to as a second folding axis FX2. The display device DD may include at least one of the first and second folding axes FX1 and FX2, and may be folded about at least one of the first and second folding axes FX1 and FX2.

FIG. 1 shows a smartphone as the display device DD, however, the embodiments are not limited to smartphones. The display device DD according to the disclosure may be applied to a large-sized electronic item, such as a television set or a monitor, and small and medium-sized electronic items, such as a mobile phone, a tablet computer, a car navigation unit, a game unit, or a smart watch.

As shown in FIG. 1, the display device DD may display an image IM on a display surface IS substantially parallel to each of the first and second directions DR1 and DR2 toward a third direction DR3. The display surface IS on which the image IM is displayed may correspond to a front surface of the display device DD.

The display surface IS of the display device DD may be divided into a multiple areas. The display surface IS of the display device DD may include a display area DA and a non-display area NDA, which are defined therein.

The display area DA may be an area in which the image IM is displayed, and a user may view the image IM through the display area DA. The display area DA may have a rectangular shape. The non-display area NDA may surround the display area DA. Accordingly, the display area DA may have a shape defined by the non-display area NDA. However, this is an example, and the non-display area NDA may be disposed adjacent to only one side of the display area DA or may be omitted. The display device DD according to the disclosure may include various embodiments that are not limited to a particular embodiment.

The non-display area NDA is an area adjacent to the display area DA, and the image IM is not displayed through the non-display area NDA. The display device DD includes a bezel area defined by the non-display area NDA.

The non-display area NDA may surround the display area DA, however, this is an example. According to an embodiment, the non-display area NDA may be defined adjacent to only a portion of an edge of the display area DA, and it should not be particularly limited.

The display device DD according to the disclosure may sense a user input TC applied thereto from the outside. The user input TC includes various forms of external inputs, such as a part of the user's body, light, heat, or pressure. In the embodiment, the user input TC is shown as a user's hand applied to the front surface of the display device DD. However, this is an example, and the user input TC may be provided in various forms as described above. In addition, the display device DD may sense the user input TC applied to a side or rear surface of the display device DD depending on a structure of the display device DD, and the disclosure should not be limited to a particular embodiment.

The display device DD may activate the display surface IS to display the image IM while sensing the user input TC. In the embodiment, an area where the user input TC is sensed is defined in the display area DA in which the image IM is displayed. However, this is an example, and the area where the user input TC is sensed may be defined in the non-display area NDA or may be defined over the entire display surface IS.

FIG. 2A is a schematic perspective view showing a state in which the display device DD shown in FIG. 1 is inwardly folded (in-folding) about the first folding axis FX1, and FIG. 2B is a schematic perspective view showing a state in which the display device DD shown in FIG. 1 is outwardly folded (out-folding) about the first folding axis FX1.

Referring to FIGS. 1 and 2A, the display device DD may be the foldable display device. The display device DD may be folded about the first folding axis FX1.

The display device DD may include multiple areas defined therein according to its operation mode. The areas may include a folding area FA and at least one non-folding area NFA1 and NFA2. The folding area FA may be defined between two non-folding areas NFA1 and NFA2.

For example, the non-folding areas NFA1 and NFA2 may include a first non-folding area NFA1 and a second non-folding area NFA2. The first non-folding area NFA1 may be adjacent to a side of the folding area FA in the first direction DR1, and the second non-folding area NFA2 may be adjacent to another side of the folding area FA in the first direction DR1.

The display device DD may be inwardly folded (in-folding) or outwardly folded (out-folding). In the following descriptions, the in-folding indicates a state in which the display device DD is folded to allow a portion of the display surface IS to face another portion of the display surface IS, and the out-folding indicates a state in which the display device DD is folded to allow a portion of the rear surface to face another portion of the rear surface.

The folding area FA is folded about the first folding axis FX1 or the second folding area FX2 to form a curvature. The first folding axis FX1 may extend in the second direction DR2, which may be a major axis direction of the display device DD, and the second folding axis FX2 may extend in the first direction DR1, which may be a minor axis direction of the display device DD.

Referring to FIG. 2A, the display device DD may be inwardly folded (in-folding) to allow the display surface IS of the first non-folding area NFA1 to face the display surface IS of the second non-folding area NFA2. As the first non-folding area NFA1 rotates in a clockwise direction about the first folding axis FX1, the display device DD may be inwardly folded. The first folding axis FX1 may be defined at a center of the display device DD in the first direction DR1 to align the first non-folding area NFA1 with the second non-folding area NFA2 when the display device DD is inwardly folded.

Referring to FIG. 2B, the display device DD may be outwardly folded (out-folding) about the first folding axis FX1. The display device DD may display the image IM when the display surface of the first non-folding area NFA1 and the display surface of the second non-folding area NFA2 are exposed to the outside. Further, the image IM may also be displayed on the display surface of the folding area FA exposed to the outside. As shown in FIG. 1, the display device DD may display the image IM while being in the unfolded state. The first non-folding area NFA1, the second non-folding area NFA2, and the folding area FA may respectively display separate images or may respectively display portions of a single image.

The display device DD may be manufactured to have both the in-folding state and the out-folding state or may be manufactured to have one of the in-folding state and the out-folding state.

Figure 3A:
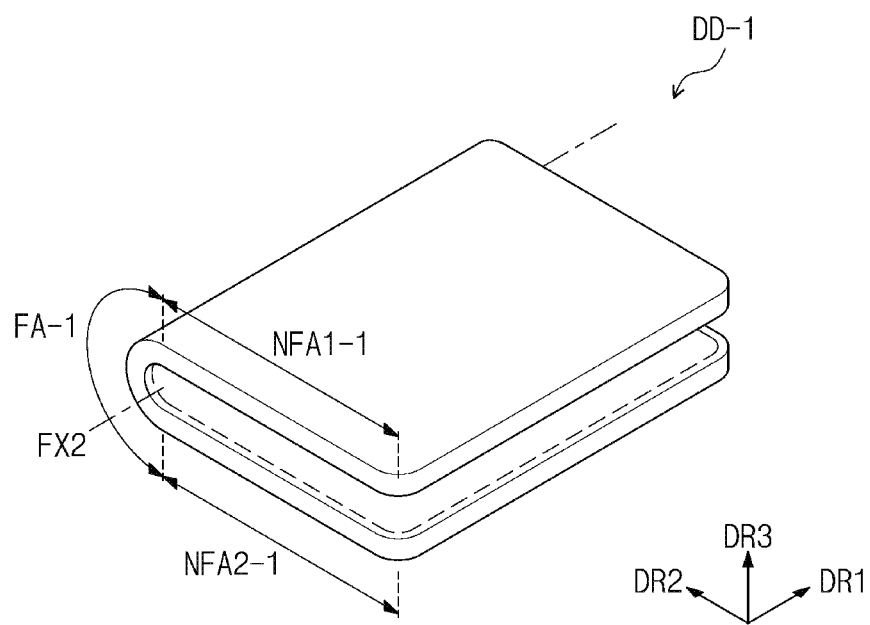
FIG. 3A is a schematic perspective view showing a state in which the display device shown in FIG. 1 is inwardly folded (in-folding) about a second folding axis.
Figure 3B:
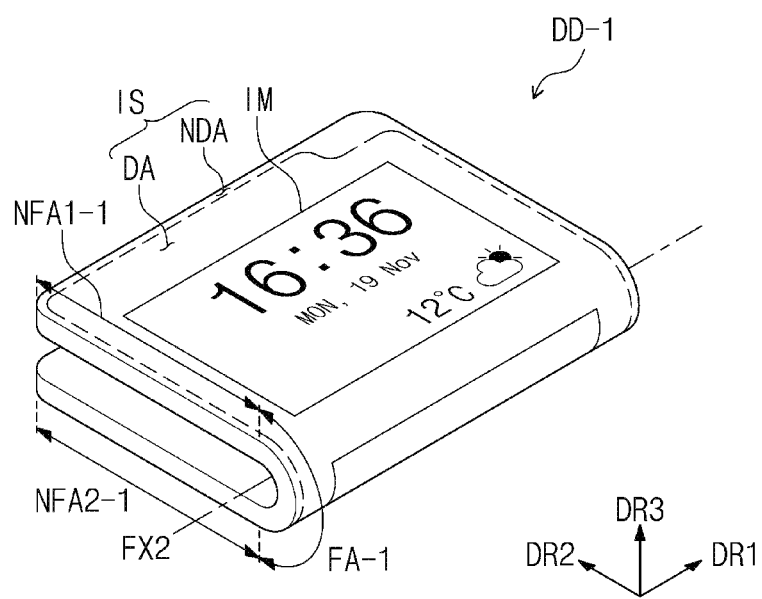
FIG. 3B is a schematic perspective view showing a state in which the display device shown in FIG. 1 is outwardly folded (out-folding) about the second folding axis.

FIG. 3A is a schematic perspective view showing a state in which the display device shown in FIG. 1 is inwardly folded (in-folding) about the second folding axis FX2, and FIG. 3B is a schematic perspective view showing a state in which the display device shown in FIG. 1 is outwardly folded (out-folding) about the second folding axis FX2.

Referring to FIGS. 3A and 3B, the display device DD-1 may include a first non-folding area NFA1-1, a folding area FA-1, and a second non-folding area NFA2-1, which are sequentially defined in the second direction DR2. The folding area FA-1 may be defined between the first non-folding area NFA1-1 and the second non-folding area NFA2-1.

The display device DD-1 may be inwardly or outwardly folded about the second folding axis FX2. The second folding axis FX2 may extend in the first direction DR1. The second folding axis FX2 may be substantially parallel to the short sides of the display device DD-1.

Hereinafter, as shown in FIGS. 2A and 2B, a structure of a display module included in the display device DD that is folded about the first folding axis FX1 substantially parallel to the long sides will be described in detail, however, the embodiments are not limited thereto or thereby. The embodiments described hereinafter may be applied to a display module included in the display device DD-1 that is folded about the second folding axis FX2 substantially parallel to the short sides as shown in FIGS. 3A and 3B.

Figure 4:
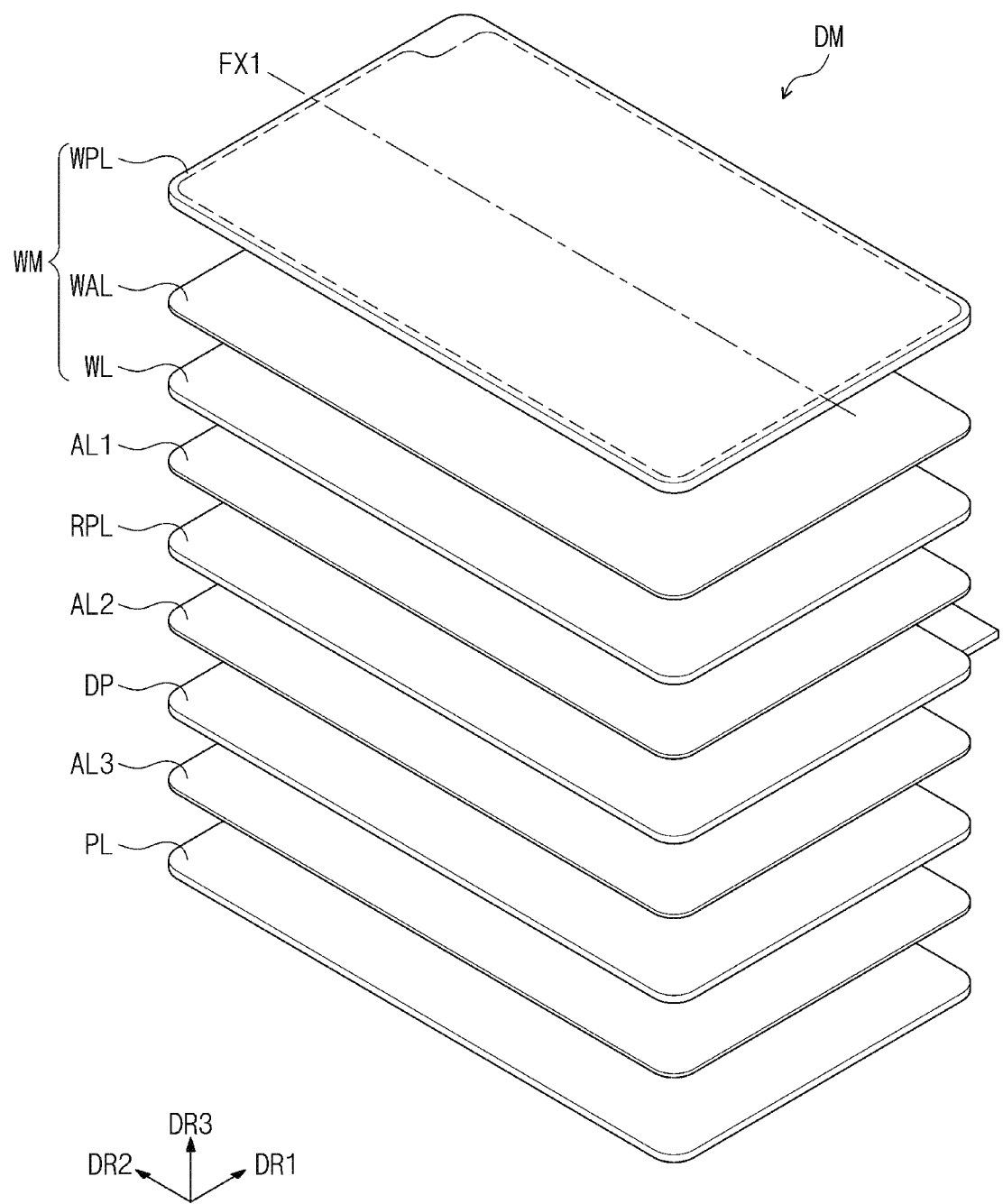
FIG. 4 is an exploded schematic perspective view showing a display module according to an embodiment of the disclosure.
Figure 5:
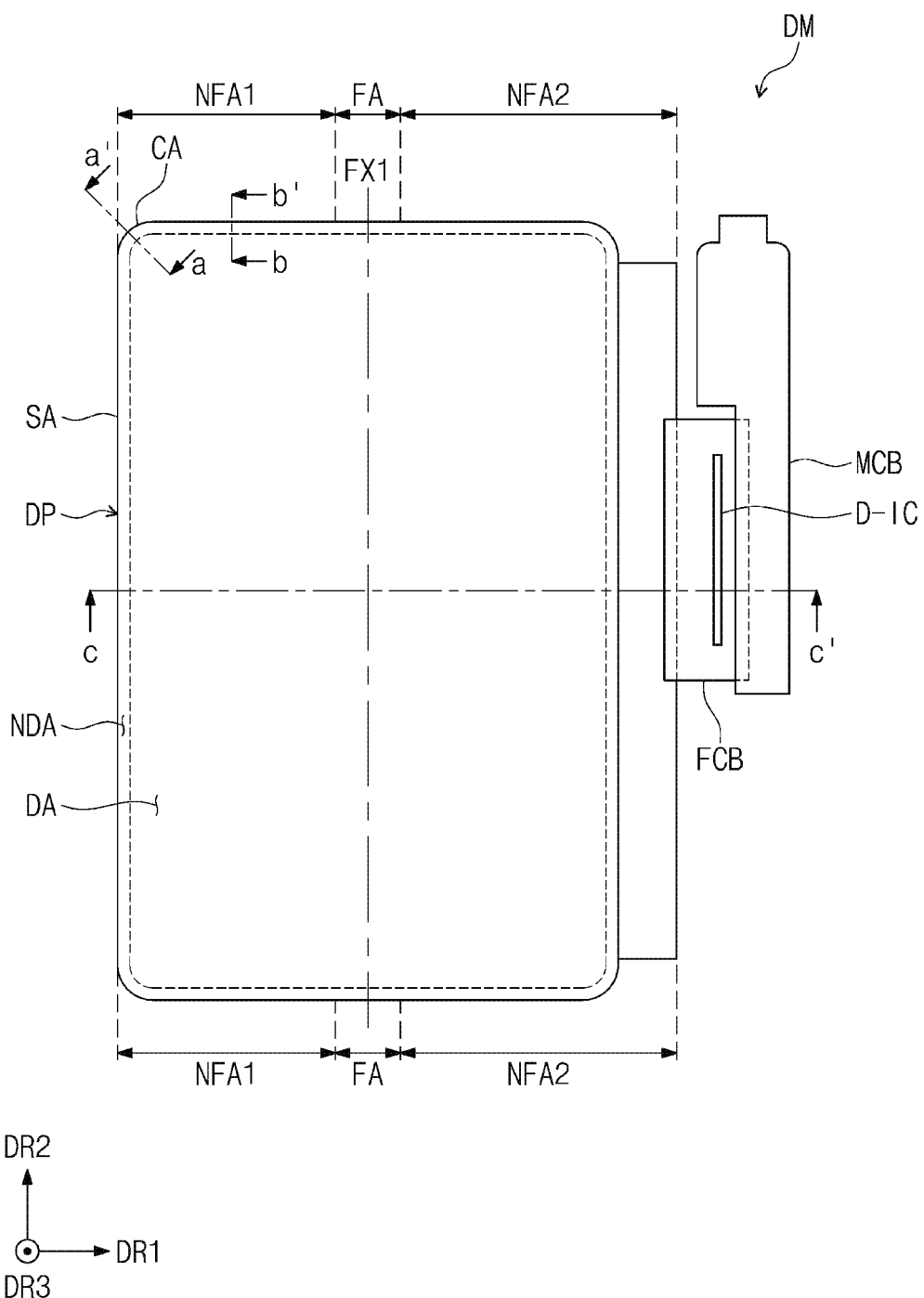
FIG. 5 is a schematic plan view showing the display module shown in FIG. 4.

FIG. 4 is an exploded schematic perspective view showing a display module DM according to an embodiment of the disclosure. FIG. 5 is a schematic plan view showing the display module DM shown in FIG. 4.

Referring to FIGS. 4 and 5, the display module DM may have a rectangular shape in a plan view. The display module DM may have the rectangular shape with rounded corners in a plan view. The display module DM may include four sides or edges. The display module DM may include short sides extending in the first direction DR1 and long sides extending in the second direction DR2 intersecting the first direction DR1.

The display module DM may have a variety of shapes. According to an embodiment, the display module DM may have a shape defined by a straight portion SA and a curved portion CA. In case that the display module DM includes straight sides, at least a portion of a corner may be a curved line. For example, when the display module DM has the rectangular shape, a portion at which straight sides meet each other may be replaced with a curved line with a curvature. Each vertex of the rectangular shape may include a curved side that has a curvature and includes two ends respectively connected to two straight sides adjacent to each other. The straight sides may form the straight portion SA, and the curved sides, each having a curvature, may form the curved portion CA.

The curvature of the curved portion CA may be set differently depending on a position of the curved portion CA. For example, the curvature of the curved portion CA may change depending on a position at which the curved line starts and the length of the curved line.

Referring to FIG. 4, the display module DM may include a window protective layer WPL, a window WL, an anti-reflective layer FC, a display panel DP, a protective layer PL, and adhesive layers WAL, AL1, AL2, and AL3.

The display module DM may be changed from a flat state, i.e., a first state, to a folded state, i.e., a second state, or the display module DM may be changed from the second state to the first state. The window protective layer WPL, the window WL, the anti-reflective layer RPL, the display panel DP, the protective layer PL, and the adhesive layers WAL, AL1, AL2, and AL3 may have a flexibility. Each of the window protective layer WPL, the window WL, the anti-reflective layer RPL, the display panel DP, the protective layer PL, and the adhesive layers WAL, AL1, AL2, and AL3 may include the folding area FA.

According to an embodiment, the display panel DP may include the folding area FA. The display panel DP may include the first non-folding area NFA1, the folding area FA, and the second non-folding area NFA2, which extend in the first direction DR1. The display panel DP may include the curved portion CA and the straight portion SA. The display panel DP may include the long sides extending in the second direction DR2, the short sides extending in the first direction DR1 crossing the second direction DR2, the curved portion CA corresponding to the portion at which the long sides meet the short sides, and the straight portion SA adjacent to the curved portion CA. The curved portion CA of the display panel DP may have a rounded shape with a curvature. According to an embodiment, there may be multiple curved portions CA of the display panel DP. For example, when the display panel DP has the rectangular shape defined by long sides and short sides, each of the four corners of the rectangular shape may be defined as the curved portion CA, however, the embodiments are not limited thereto or thereby.

The window protective layer WPL may be optically transparent. The window protective layer WPL may form an outermost surface of the display module DM. An upper surface of the window protective layer WPL may form an uppermost surface of the display module DM. According to an embodiment, other elements may not be disposed above the window protective layer WPL of the display module DM.

The window protective layer WPL may protect components disposed thereunder. The window protective layer WPL may include a protective film. In addition to the protective film, the window protective layer WPL may be provided with a hard coating layer and an anti-fingerprint layer disposed on an upper surface and/or a lower surface of the protective film to improve properties, such as, chemical resistance and abrasion resistance.

The window WL may be disposed under the window protective layer WPL. The window WL may be optically transparent. The window protective layer WPL and the window WL may be coupled with each other by a window adhesive layer WAL. The window WL may include an optically transparent insulating material. The window WL may have a single-layer or multi-layer structure.

Although not shown in figures, a hard coating layer may be disposed on an upper surface of the window WL. The hard coating layer may be coated on the upper surface of the window WL as a functional layer that improves characteristics of use of the display device DD (refer to FIG. 1). For example, the hard coating layer may improve anti-pollution characteristics, scratch-resistant characteristics, impact resistance, and the like. The hard coating layer may have a thickness greater than or equal to about 1 µm and less than or equal to about 5 µm, e.g., about 1.5 µm.

Although not shown in figures, an impact absorbing layer may be disposed on a lower surface of the window WL. The impact absorbing layer may be a functional layer to protect the display module DM from external impacts. The impact absorbing layer may be selected from films having an elastic modulus greater than or equal to about 1 GPa at room temperature. The impact absorbing layer may be a stretched film that includes an optical function. For example, the impact absorbing layer may be an optical axis control film whose optical axis is controlled. The impact absorbing layer may have a thickness from about 35 µm to about 45 µm, e.g., about 41 µm, however, the thickness of the impact absorbing layer should not be limited thereto or thereby. According to an embodiment of the disclosure, the impact absorbing layer may be omitted.

A black matrix may be disposed on a surface of the window WL. The black matrix may be printed and provided on a surface of the impact absorbing layer. The black matrix may overlap the non-display area NDA. The black matrix may be formed as a color layer by a coating method. The black matrix may include a colored organic material or an opaque metal material, however, a material for the black matrix should not be limited thereto or thereby.

The anti-reflective layer RPL may be disposed under the window WL. The window WL may be disposed on the anti-reflective layer RPL with a first adhesive layer AL1 disposed between the window WL and the anti-reflective layer RPL. The anti-reflective layer RPL may reduce a reflectance of an external light incident thereto from the outside of the display device DD (refer to FIG. 1). According to an embodiment of the disclosure, the anti-reflective layer RPL may be omitted or may be built in the display module DM.

According to an embodiment, the anti-reflective layer RPL may include a retarder and a polarizer. The retarder may be a film type or liquid crystal coating type and may include a λ/2 retarder and/or a λ/4 retarder. The polarizer may be a film type and may include a stretching type polymer resin film (a stretched polymer resin film). The retarder and the polarizer may further include a protective film. The retarder and the polarizer or the protective film may be defined as a base layer of the anti-reflective layer RPL.

The anti-reflective layer RPL according to an embodiment of the disclosure may include multiple color filters. The color filters may be disposed in an array. The arrangement of the color filters may be determined by taking into account emission colors of the pixels included in the display module DM. The disposition of the array of color filters may be based on the emission colors of the pixels from the display module DM. The anti-reflective layer RPL may further include a black matrix adjacent to the color filters.

The anti-reflective layer RPL according to an embodiment of the disclosure may include a destructive interference structure. The destructive interference structure may include a first reflective layer and a second reflective layer disposed on a layer different from a layer on which the first reflective layer is disposed. A first reflective light and a second reflective light, which are respectively reflected from the first reflective layer and the second reflective layer, may destructively interfere with each other, and thus, the reflectance of the external light may be reduced.

The display panel DP may be disposed under the anti-reflective layer RPL. The anti-reflective layer RPL may be disposed on the display panel DP with a second adhesive layer AL2 disposed between the anti-reflective layer RPL and the display panel DP. According to an embodiment of the disclosure, the second adhesive layer AL2 may be omitted, and the anti-reflective layer RPL may be disposed directly on the display panel DP. The display panel DP may generate images. The display panel DP may be a liquid crystal display panel or a light-emitting type display panel, however, the embodiments are not particularly limited. For instance, the light-emitting type display panel may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Although not shown in the drawings, the display module DM may further include an input sensing unit disposed on the display panel DP.

The display panel DP may include a base layer, a circuit element layer disposed on the base layer, a display element layer disposed on the circuit element layer, and a thin film encapsulation layer disposed on the display element layer.

The base layer may be flexible. The base layer may have a single-layer or multi-layer structure. The base layer may include a plastic substrate, a glass substrate, a metal substrate, or an organic/inorganic composite substrate. The base layer may include a synthetic resin film. For example, the synthetic resin film may include a polyimide-based resin, an acrylic-based resin, a vinyl-based resin, an epoxy-based resin, a urethane-based resin, a cellulose-based resin, or a perylene-based resin. However, the embodiments of the material for the synthetic resin film are not limited to the above described materials.

The circuit element layer may be disposed on the base layer. The circuit element layer may include an insulating layer, a semiconductor pattern, a conductive pattern, and a signal line. An insulating layer, a semiconductor layer, and a conductive layer may be formed on the base layer by a coating or depositing process. The insulating layer, the semiconductor layer, and the conductive layer may be selectively patterned through several photolithography processes, thus forming the insulating layer, the semiconductor pattern, the conductive pattern, and the signal line included in the circuit element layer.

The display element layer may be disposed on the circuit element layer. The display element layer may be disposed to correspond to the display area DA of the display device. The display element layer may include a light emitting element of the pixels. For example, the display element layer may include an organic light emitting material, a quantum dot, a quantum rod, a micro-LED, or a nano-LED.

The thin film encapsulation layer may be disposed on the circuit element layer to cover the display element layer. The thin film encapsulation layer may include inorganic layers and an organic layer disposed between the inorganic layers, however, layers included in the thin film encapsulation layer should not be limited thereto or thereby. The inorganic layers included in the thin film encapsulation layer may protect the pixels from moisture and oxygen, and the organic layer included in the thin film encapsulation layer may protect the pixels from a foreign substance such as dust particles. The inorganic layers may include a silicon nitride layer, a silicon oxide layer, a silicon oxynitride layer, a titanium oxide layer, or an aluminum oxide layer. The organic layer may include an acrylic-based organic layer. However, the embodiments of the thin film encapsulation layer are not limited thereto or thereby.

The display panel DP may include pixels that generate images in response to electrical signals applied thereto. Each of the pixels may include the light emitting element included in the display element layer and thin film transistors included in the circuit element layer and electrically connected to the light emitting element. The pixels may be disposed to correspond to the display area DA, however, the embodiments are not limited thereto or thereby. According to an embodiment, some of the pixels may be disposed in the non-display area NDA.

The protective layer PL may be disposed under the display panel DP with a third adhesive layer AL3 disposed therebetween. The protective layer PL may protect the rear surface of the display panel DP.

Figure 8A:
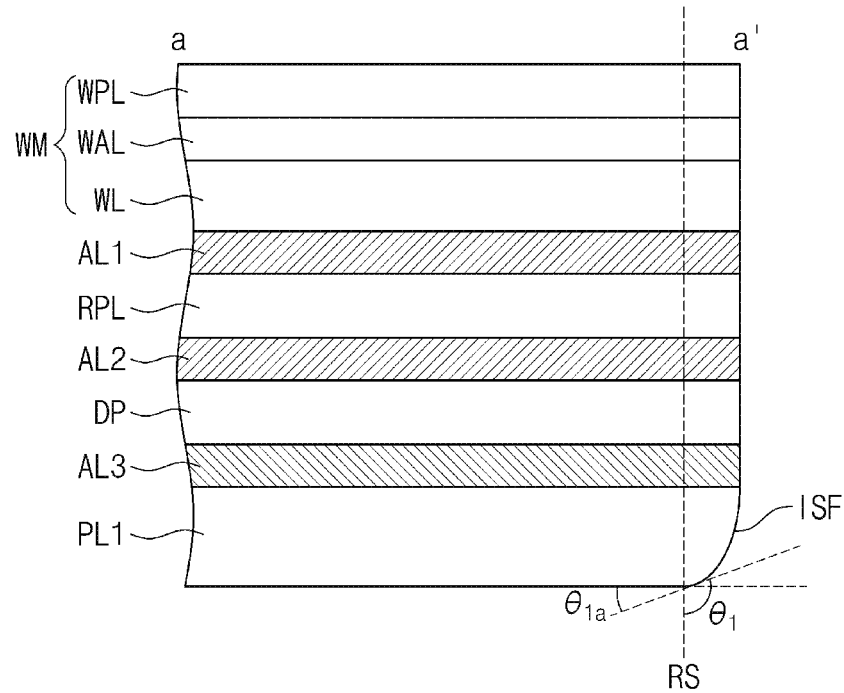
FIG. 8A is a schematic cross-sectional view taken along a line a-a' shown in FIG. 5.
Figure 8B:
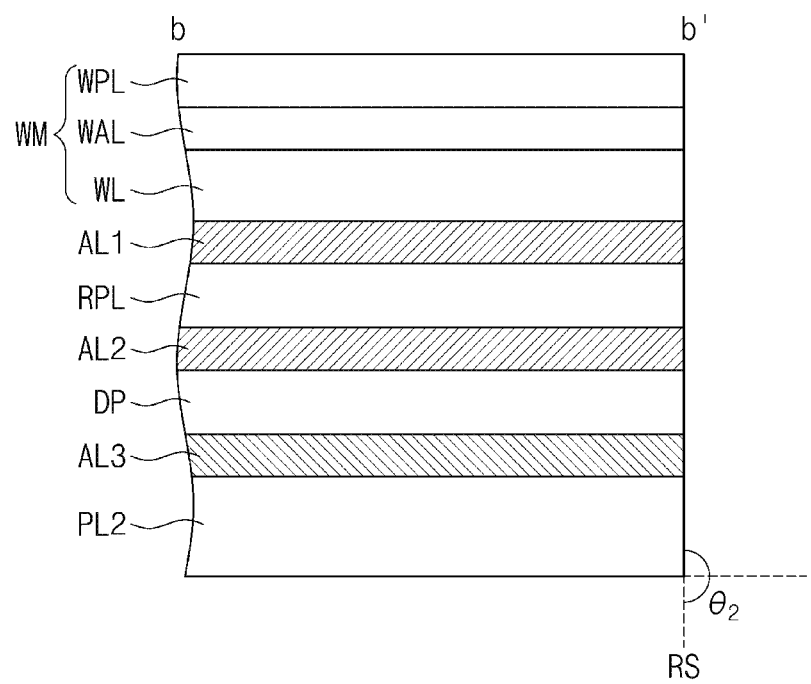
FIG. 8B is a schematic cross-sectional view taken along a line b-b' shown in FIG. 5.

Referring to FIGS. 5, 8A, and 8B, the protective layer PL may include a first protective portion PL1 corresponding to the curved portion CA of the display panel DP and a second protective portion PL2 corresponding to the straight portion SA of the display panel DP. In a case where there are multiple curved portions CA of the display panel DP, the first protective portion PL1 of the protective layer PL may correspond to at least one of the curved portions CA. The first protective portion PL1 and the second protective portion PL2 will be described in detail below.

The protective layer PL may include a polymer film. For example, the protective layer PL may include a polyimide film, a polyamide film, a polyetheretherketone film, and a polyethylene terephthalate film. The polymer film included in the protective layer PL may have a thickness of about 20 μm to about 50 The polymer film included in the protective layer PL may have a high modulus to protect the display module DM from external impacts.

The protective layer PL may include a cushion layer. The protective layer PL may include a sponge, a foam, or a polyurethane resin. For example, the protective layer PL may include a polyurethane foam or a thermoplastic polyurethane foam. As another way, the protective layer PL may include an acrylonitrile butadiene styrene copolymer (ABS) foam, a polyethylene (PE) foam, an ethylene vinyl acetate (EVA) foam, or a polyvinyl chloride (PVC) foam. The protective layer PL may have a structure in which the cushion layer is formed by using the polymer film as its base layer. The cushion layer may have a modulus and a density, which are smaller than those of the polymer film, to absorb the external impacts. The cushion layer may have a thickness greater than or equal to about 80 μm and less than or equal to about 120 μm.

The protective layer PL may have a color that absorbs light. For example, the protective layer PL may have a black color. At least one of the polymer film and the cushion layer, which are included in the protective layer PL, may include a black material. Accordingly, elements disposed under the protective layer PL may be prevented from being viewed from the outside.

Referring to FIG. 5, the display module DM may further include a flexible circuit board FCB connected to the display panel DP and a driving chip D-IC mounted on the flexible circuit board FCB. The flexible circuit board FCB may be connected to a main circuit board MCB. Parts, such as a control chip, passive elements, active elements, and the like, may be mounted on the main circuit board MCB. Like the flexible circuit board FCB, the main circuit board MCB may include a flexible film.

In the embodiment, a chip-on-film (COF) structure in which the driving chip D-IC is mounted on the flexible circuit board FCB is shown. In the chip-on-film structure, the display module DM may include two circuit boards FCB and MCB, however, the embodiments are not limited thereto or thereby. The display module DM may have a chip-on-panel (COP) structure in which the driving chip D-IC is mounted on the display panel DP.

Figure 6:
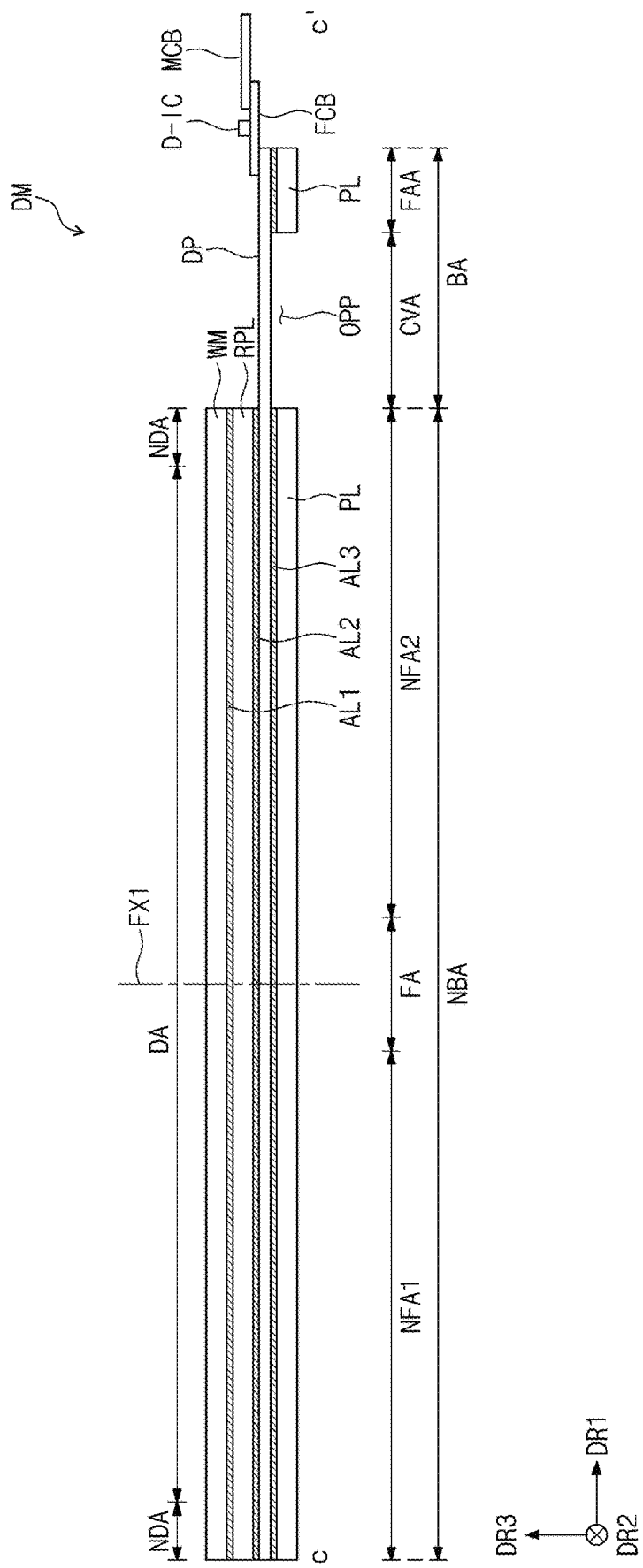
FIGS. 6 and 7 are schematic cross-sectional views taken along a line c-c' shown in FIG. 5.
Figure 7:
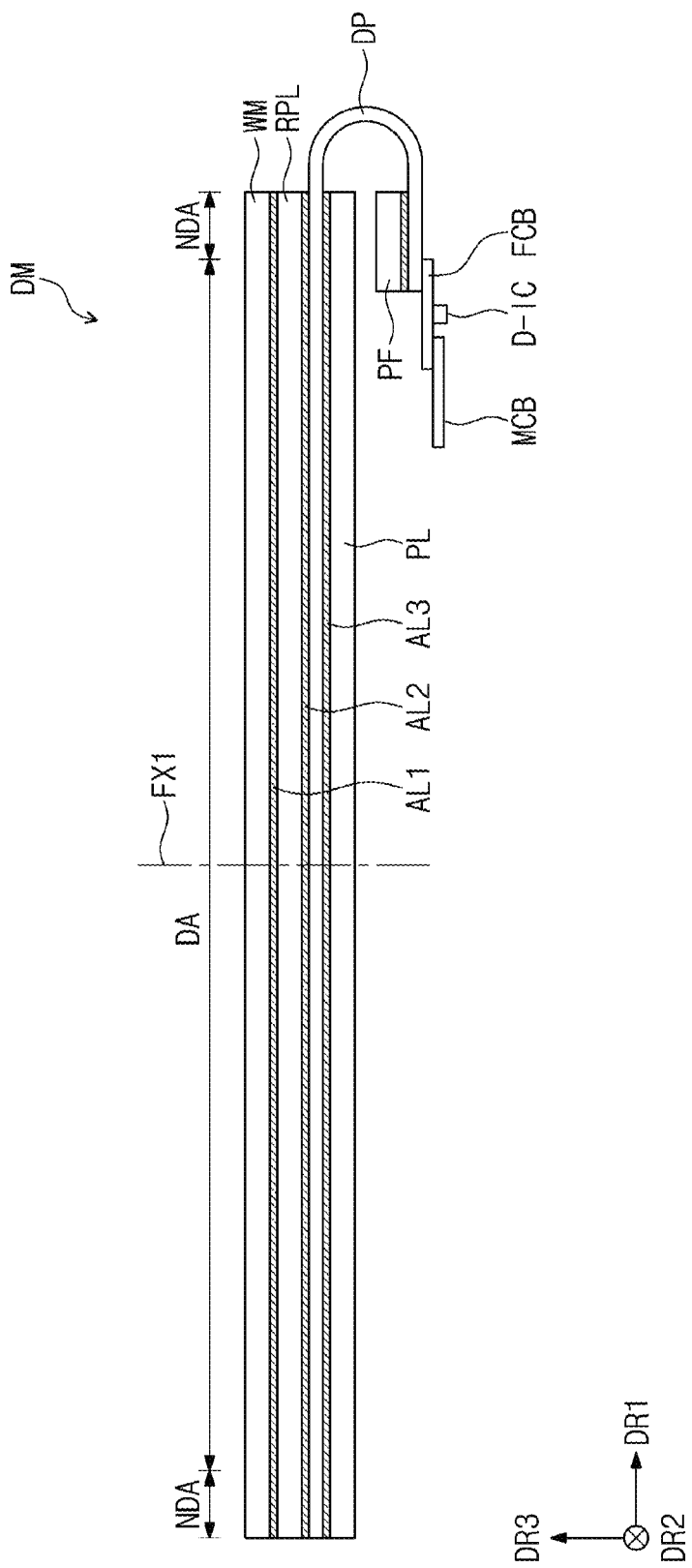

FIGS. 6 and 7 are cross-sectional views taken along a line c-c' shown in FIG. 5. FIG. 7 is a cross-sectional view showing a state in which a portion of the display panel shown in FIG. 5 is bent.

Referring to FIGS. 5 to 7, the display module DM may include the flexible display panel DP. The display panel DP may include a bending area BA and a non-bending area NBA. The non-bending area NBA may include the display area DA and the non-display area NDA of the display module DM, and the bending area BA may correspond to a portion of the display panel DP and may be bent at a curvature. The folding area FA and the first and second non-folding areas NFA1 and NFA2 of the display module DM may be included in the non-bending area NBA.

The bending area BA may include a curvature area CVA having the curvature in a bent state and a facing area FAA facing the non-bending area NBA in the bent state. The curvature area CVA may be adjacent to the non-bending area NBA and may be substantially bent. The facing area FAA may be adjacent to the curvature area CVA and may be flat without being bent. As the curvature area CVA of the display panel DP is bent, the facing area FAA may face the non-bending area NBA and may be spaced apart from the non-bending area NBA. The flexible circuit board FCB may be connected to the facing area FAA of the display panel DP.

The protective layer PL may be disposed to correspond to the non-bending area NBA and the facing area FAA and may not be disposed in the curvature area CVA. The protective layer PL may be provided with a bending opening OPP defined therethrough to correspond to the curvature area CVA. Since the protective layer PL is removed in the curvature area CVA, a stress occurring in the curvature area CVA when the bending area BA is bent may be reduced. When the bending opening OPP is defined through the protective layer PL, the first adhesive layer AL1 may be removed from an area corresponding to the bending opening OPP.

According to an embodiment, the protective layer PL may be provided with a groove defined therein to correspond to the curvature area CVA. The protective layer PL may have a thickness that is thinner in the curvature area CVA than that in other areas NBA and FAA.

FIG. 8A is a schematic cross-sectional view taken along a line a-a' shown in FIG. 5 to show the curved portion of the display module, and FIG. 8B is a schematic cross-sectional view taken along a line b-b' shown in FIG. 5 to show the straight portion of the display module. In FIGS. 8A and 8B, the same reference numerals denote the same elements in FIGS. 1 to 5, and thus, repetitive descriptions of the same elements will be omitted.

Referring to FIGS. 5, 8A, and 8B, a side surface of the curved portion CA of the display module DM may be different from a side surface of the straight portion SA of the display module DM. The side surface of the curved portion CA of the display module DM may include the first protective portion PL1 of the protective layer PL, and the side surface of the straight portion SA of the display module DM may include the second protective portion PL2 of the protective layer PL. In case that the display module DM includes multiple curved portions CA, only the side surface of at least one of the curved portions CA may be different from the side surface of the straight portion SA, and the side surface of the other curved portions CA may be substantially the same as the side surface of the straight portion SA. The side surface of the at least one of the curved portions CA may include the first protective portion PL1 of the protective layer PL, and the side surface of the other curved portions CA and the side surface of the straight portion SA may include the second protective portion PL2 of the protective layer PL. According to an embodiment, the length of the side surface of the first protective portion PL1 may be longer than the length of the side surface of the second protective portion PL2.

Referring to FIGS. 5 and 8A, the side surface of the curved portion CA of the display module DM may include the first protective portion PL1, the display panel DP, the anti-reflective layer RPL, the window WL, the window protective layer WPL, and the adhesive layers AL1, AL2, AL3, and WAL.

The side surface of the curved portion CA of the display module DM may include an inclined surface ISF inclined at an angle. The side surface of the curved portion CA of the display module DM may include the first protective portion PL1, and the side surface of the first protective portion PL1 may include the inclined surface ISF inclined at a predetermined angle ($\theta_1$) with respect to a reference surface RS substantially parallel to the third direction DR3. For example, the side surface of the first protective portion PL1 may include the inclined surface ISF that is inclined at an angle greater than or equal to about 100° and less than or equal to about 150° with respect to the reference surface RS. According to an embodiment, the inclined surface ISF may be a convex inclined surface protruded from the reference surface RS substantially parallel to the third direction DR3. The inclined surface ISF may have a curved shape in which an angle between the inclined surface ISF and the reference surface RS increases as a distance from an edge of the display module DM decreases. The inclined surface ISF may be formed to allow a slope of a tangent line to increase as a distance from an edge of the display module DM decreases, and thus, the inclined surface ISF may be provided as a curved shape with a curvature. The slope of the tangent line may gradually increase in a portion adjacent to a lower surface of the first protective portion PL1, and the slope of the tangent line may increase sharply as a distance from an upper surface of the first protective portion PL1 decreases. Accordingly, the side surface of the curved portion CA of the display module DM may include the inclined surface ISF that has a blunt edge rather than a sharp edge. According to an embodiment, an angle ($\theta_{1a}$) between the lower surface of the first protective portion PL1 and the inclined surface ISF may be greater than or equal to about 10° and less than or equal to about 60°.

Portions (hereinafter, referred to as side surfaces) of the side surface of the curved portion CA of the display module DM except a portion corresponding to the side surface of the first protective portion PL1 may be substantially parallel to the reference surface RS. For instance, the side surfaces of the third adhesive layer AL3, the display panel DP, the second adhesive layer AL2, the anti-reflective layer RPL, the first adhesive layer AL1, the window WL, the window adhesive layer WAL, and the window protective layer WPL may be aligned with each other to be parallel to the reference surface RS. Accordingly, the side surfaces among the side surfaces of the curved portion CA except the side surface of the first protective portion PL1 may be flat. However, the shape of the side surface of the curved portion CA are not limited thereto or thereby. The inclined surface ISF may be formed in the first protective portion PL1 and in at least one of layers disposed on the first protective portion PL1. For example, the inclined surface ISF may be formed in the first protective portion PL1 and the third adhesive layer AL3 disposed on the first protective portion PL1, and the side surface of the first protective portion PL1 and the side surface of the third adhesive layer AL3 may be the curved surface with the curvature.

As described above, when the side surface of the curved portion CA of the display module DM includes a curved surface and a flat surface, the curved surface and the flat surface may be connected to each other so that the surfaces may be differentiable. The curved surface and the flat surface may be connected to each other to have a continuous slope. For example, as shown in FIG. 8A, when the inclined surface ISF is formed in the side surface of the first protective portion PL1, the side surface of the first protective portion PL1 may be connected to the side surface of the third adhesive layer AL3. Accordingly, a tangential slope of the side surface of the first protective portion PL1 at a point where the side surface of the first protective portion PL1 and the side surface of the third adhesive layer AL3 are connected to each other may be the same as a tangential slope of the side surface of the third adhesive layer AL3.

Referring to FIGS. 4, 5, and 8B, the side surface of the straight portion SA of the display module DM may include the second protective portion PL2 of the protective layer PL, the display panel DP, the anti-reflective layer RPL, the window layer WL, the window protective layer WPL, and the adhesive layers AL1, AL2, AL3, and WAL.

The side surface of the straight portion SA of the display module DM may be substantially flat. The side surface of the straight portion SA of the display module DM may be substantially parallel to the reference surface RS. For instance, the side surfaces of the second protective portion PL2, the third adhesive layer AL3, the display panel DP, the second adhesive layer AL2, the anti-reflective layer RPL, the first adhesive layer AL1, the window WL, the window adhesive layer WAL, and the window protective layer WPL may be aligned parallel to the reference surface RS. For example, an uppermost end of the side surface of the second protective portion PL2 may coincide with a lowermost end of the side surface of the third adhesive layer AL3, and an uppermost end of the side surface of the third adhesive layer AL3 may coincide with a lowermost end of the side surface of the display panel DP. However, the shape of the side surface of the straight portion SA is not limited thereto or thereby. The side surface of the second protective portion PL2 may be inclined at an angle ($\theta_2$) with respect to the reference surface RS substantially parallel to the third direction DR3. The side surface of the second protective portion PL2 may be inclined at an angle greater than or equal to about 170° and less than or equal to about 180° with respect to the reference surface RS.

Figure 9:
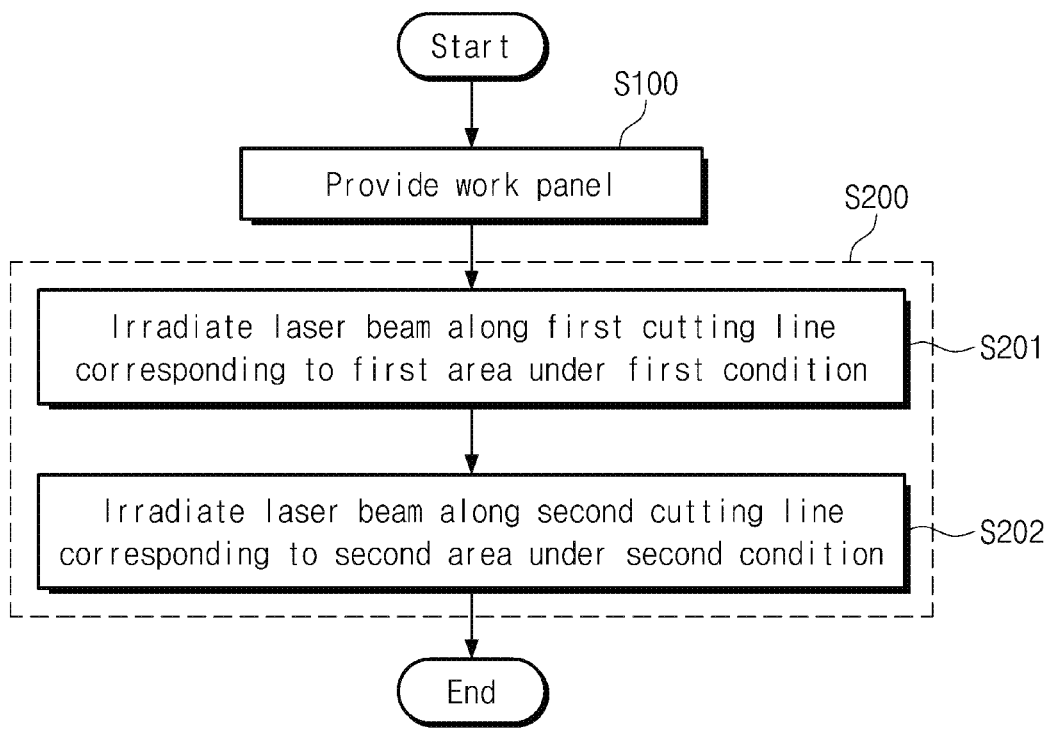
FIG. 9 is a flowchart showing a method of manufacturing a display device according to an embodiment of the disclosure.
Figure 10:
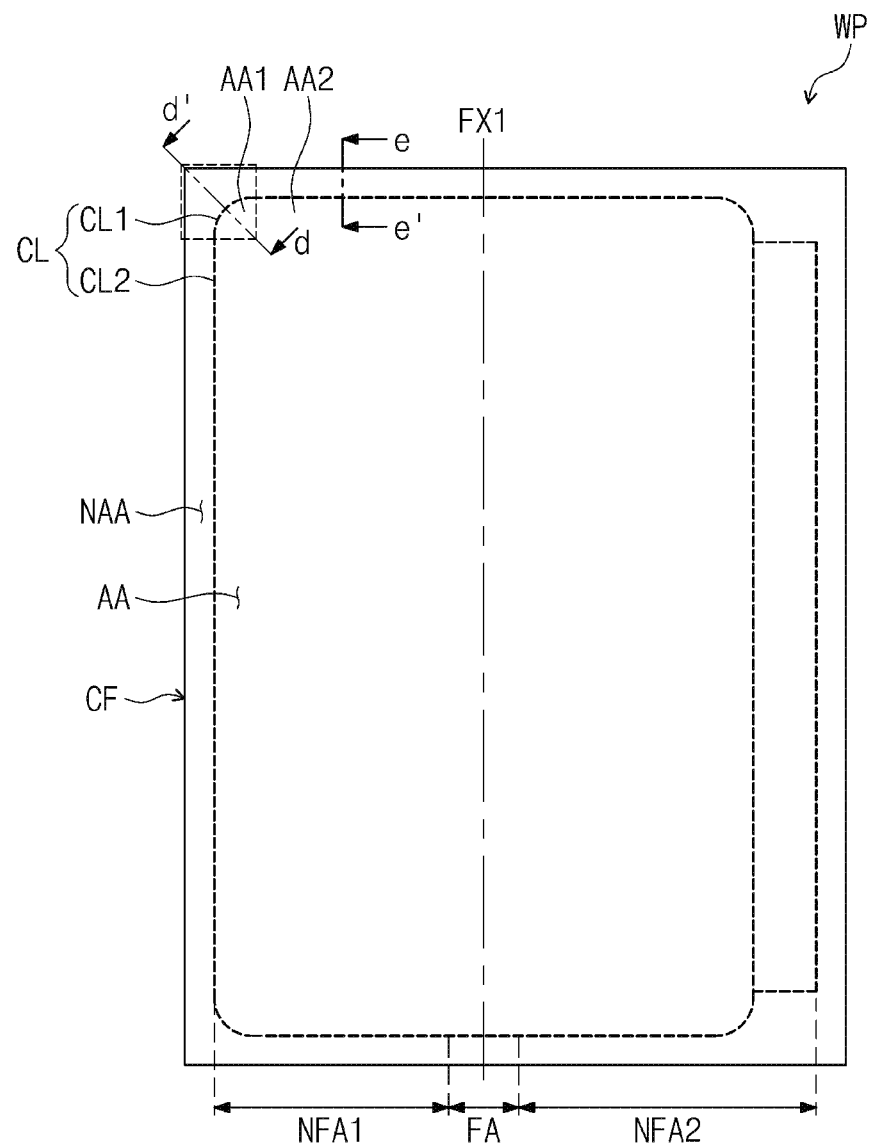
FIGS. 10 and 11 are schematic plan views showing a method of manufacturing a display device according to an embodiment of the disclosure.
Figure 11:
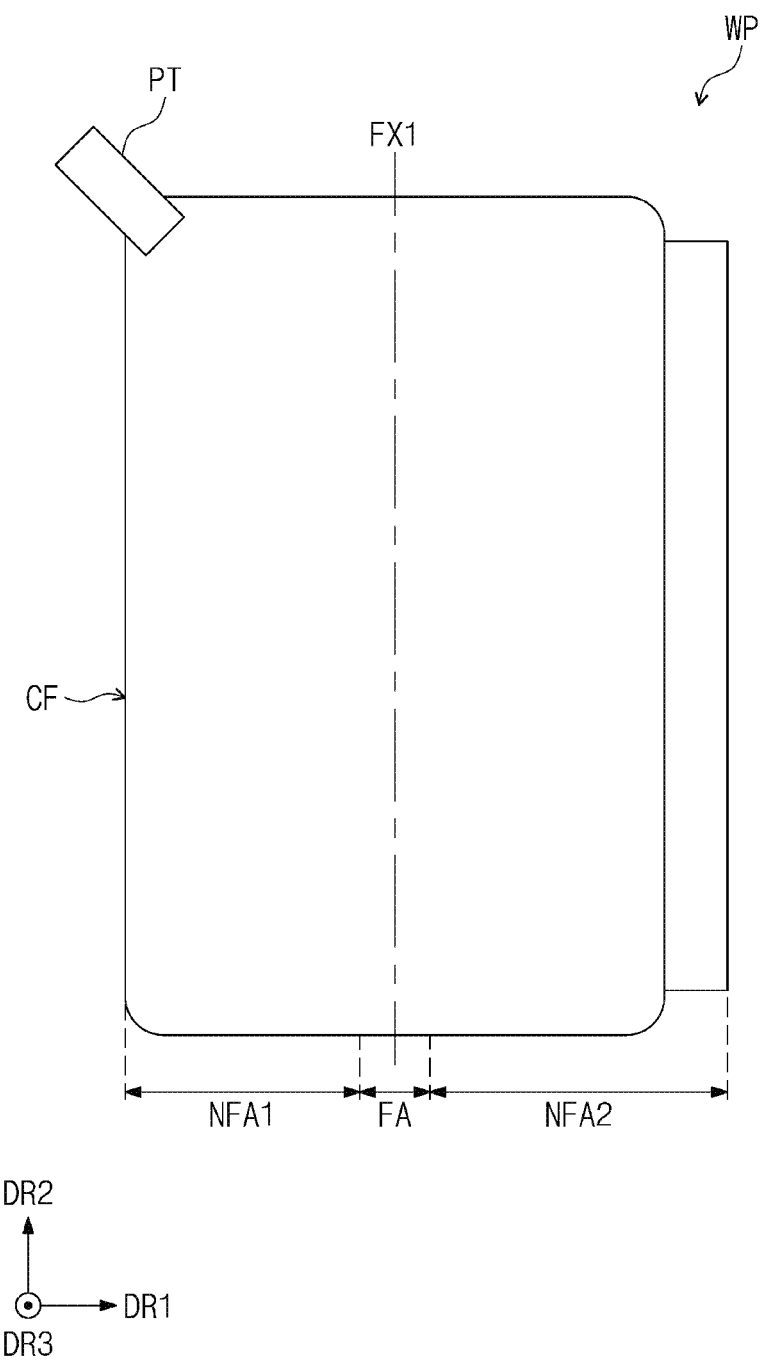
Figure 12A:
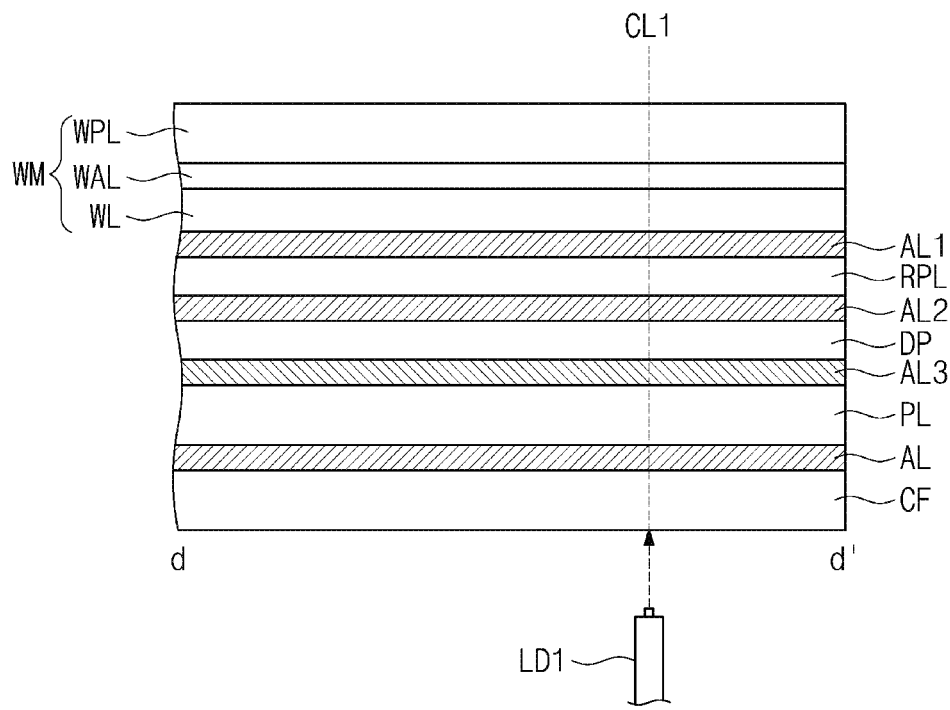
FIGS. 12A and 12B are schematic views showing processes of irradiating a laser beam under a first condition.
Figure 12B:
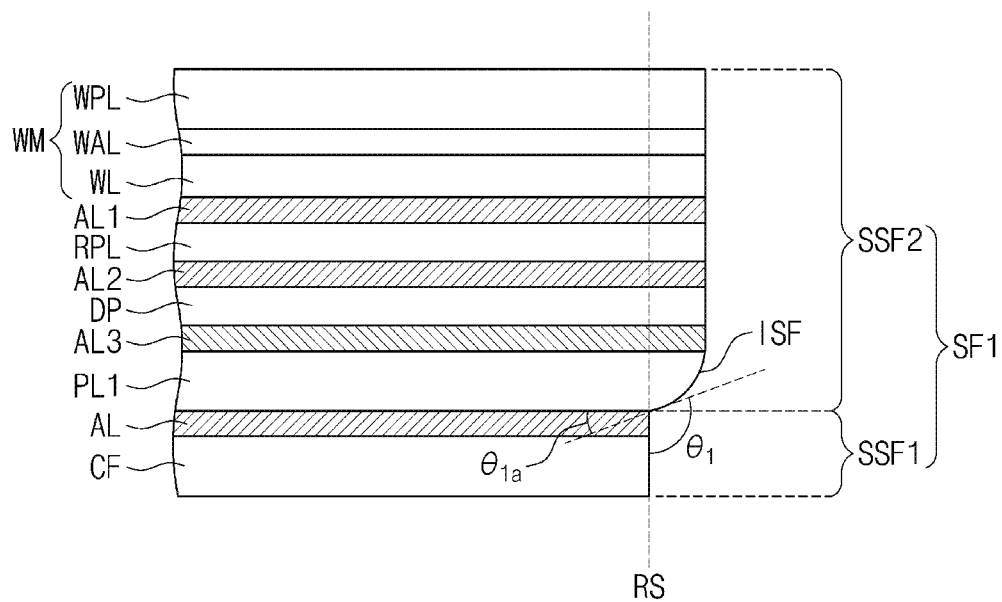
Figure 13A:
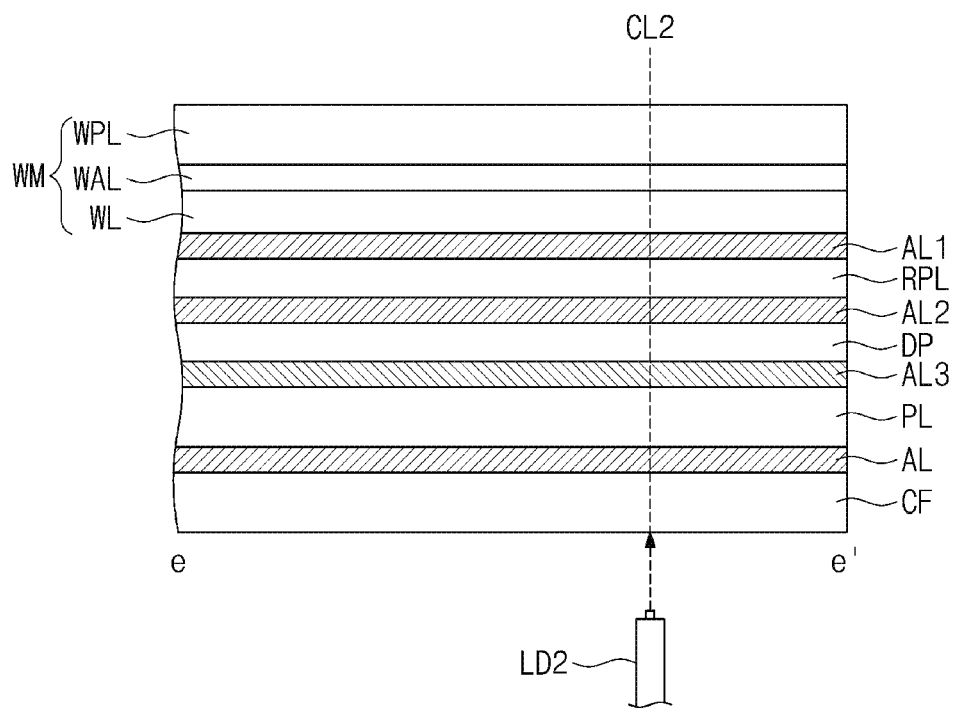
FIGS. 13A and 13B are schematic views showing processes of irradiating a laser beam under a second condition.
Figure 13B:
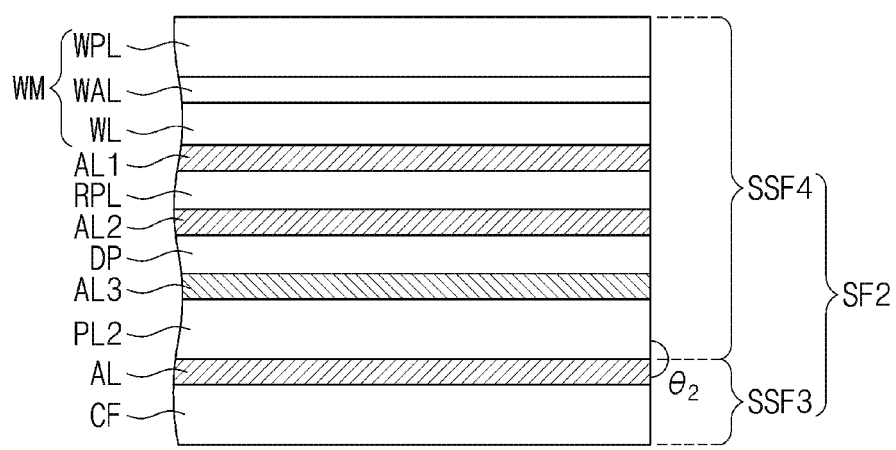

FIG. 9 is a flowchart showing a method of manufacturing a display device according to an embodiment of the disclosure. FIGS. 10 and 11 are plan views showing a method of manufacturing a display device according to an embodiment of the disclosure. FIGS. 12A and 12B are schematic views showing processes of irradiating a laser beam under a first condition. FIGS. 13A and 13B are schematic views showing processes of irradiating a laser beam under a second condition. FIGS. 12A and 12B are schematic cross-sectional views taken along a line d-d' shown in FIG. 10, and FIGS. 13A and 13B are schematic cross-sectional views taken along a line e-e' shown in FIG. 10. In FIGS. 9 to 11, 12A, 12B, 13A, and 13B, the same reference numerals denote the same elements in FIGS. 4 to 7, 8A, and 8B, and thus, repetitive descriptions of the same elements will be omitted.

Referring to FIG. 9, the manufacturing method of the display device according to an embodiment may include providing a work panel (S100) and irradiating the laser beam on to the work panel to cut the work panel (S200). The cutting of the work panel (S200) may include irradiating the laser beam along a first cutting line corresponding to a first area under the first condition (S201) and irradiating the laser beam along a second cutting line corresponding to a second area under the second condition different from the first condition (S202). According to an embodiment, the irradiating of the laser beam under the first condition and the irradiating of the laser beam under the second condition may be performed continuously.

Referring to FIGS. 10, 12A, and 13A, the work panel WP may be provided to form the display module DM. The work panel WP may include a carrier film CF, the protective layer PL, the display panel DP, the anti-reflective layer RPL, the window WL, the window protective layer WPL, and adhesive layers AL, AL1, AL2, AL3, and WAL. The work panel WP may partially correspond to the display module DM shown in FIG. 5.

The work panel WP may further include the carrier film CF when compared with the display module DM shown in FIG. 5. The carrier film CF may be attached to a lower surface of the protective layer PL by the adhesive layer AL. The carrier film CF may prevent damage to the display panel DP due to movement of the display panel DP during processing. For example, the carrier film CF may include an insulating film.

According to an embodiment, the carrier film CF may include the first area AA1 to which a peeling tape is attached and the second area AA2 adjacent to the first area AA1. The first area AA1 may correspond to the curved portion CA of the display module DM shown in FIG. 5, and the second area AA2 may correspond to the straight portion SA of the display module DM shown in FIG. 5.

Referring to FIGS. 10 and 11, the work panel WP may include an effective area AA and a non-effective area NAA, which are distinguished from each other with respect to a cutting line CL. The work panel WP may include the cutting line CL formed along an edge of the effective area AA. The cutting line CL may include the first cutting line CL1 corresponding to the first area AA1 and the second cutting line CL2 corresponding to the second area AA2. After irradiating the laser beam to cut the work panel WP, the non-effective area NAA may be removed. As shown in FIG. 10, the first cutting line CL1 corresponding to the first area AA1 may include a curved line with a curvature. According to an embodiment, the first cutting line CL1 may have a length greater than or equal to about 1.0 cm and less than or equal to about 1.5 cm, however, the embodiments are not limited thereto or thereby.

The carrier film CF may be a protective film to prevent scratches or impacts from occurring in the display panel DP during the processing. The carrier film CF may be required to be attached and detached at each process. According to an embodiment, the manufacturing method of the display device may further include attaching the peeling tape PT to a portion of the carrier film CF and removing the carrier film CF from the display panel DP after the cutting of the work panel WP (S200).

Referring to FIGS. 5, 10, and 11, the peeling tape PT may be attached to a rear surface of the carrier film CF to remove the carrier film CF attached to the display module DM. According to an embodiment, the peeling tape PT may be attached to one of the curved portions CA. FIG. 11 shows a structure in which the peeling tape PT is attached to one of the curved portions CA as a representative example, however, the structure should not be limited thereto or thereby. According to an embodiment, multiple peeling tapes PT may be provided, and the peeling tapes PT may be attached to multiple curved portions CA. According to an embodiment, the peeling tape PT may be attached to one of two curved portions CA that are not adjacent to the flexible circuit board FCB of the display module DM. The carrier film CF may include two first areas AA1 respectively corresponding to two curved portions CA that are not adjacent to the flexible circuit board FCB, and the peeling tape PT may be attached to one of the two first areas AA1, however, the embodiments are not limited thereto or thereby.

When the carrier film CF is removed using the peeling tape PT, the peeling tape PT may be attached to and detached from the carrier film CF without removing the carrier film CF from the display module DM, and the display module DM (refer to FIG. 5) may be damaged. For example, when the display module DM (refer to FIG. 5) is shaken while the carrier film CF is not completely removed, the display module DM (refer to FIG. 5) may be cracked.

According to the disclosure, by having different settings (or conditions) for irradiating the laser beam on to the first cutting line CL1, corresponding to the first area AA1 where the peeling tape PT is attached to the carrier film CF, compared to irradiating the laser beam on to the second cutting line CL2, corresponding to the second area AA2 where the peeling tape PT is not attached to the carrier film CF, damage caused by shaking the display module DM in the first area AA1 may be prevented. For example, when a processing speed of the laser beam is set to a slow speed when irradiating the first cutting line CL1, corresponding to the first area AA1 where the peeling tape PT is attached to the carrier film CF, an angle between the carrier film CF and a layer disposed on the carrier film CF may be reduced, and thus, the carrier film CF may be efficiently detached from the display module DM. Hereinafter, in the embodiments, the speed of a laser beam, or the processing speed of a laser beam, may refer to the speed at which the laser beam moves over a cutting line while irradiating on to the material on the cutting line.

Referring to FIGS. 10 and 12A, the manufacturing method of the display device may include cutting the work panel along the first cutting line CL1 corresponding to the first area AA1 of the display module DM. A first laser process in which the laser beam may be irradiated to the first cutting line CL1 corresponding to the first area AA1 under the first settings (or condition) may be performed. The first laser process may be performed using a first laser beam device LD1. The irradiating of the laser beam under the first condition may include disposing the first laser beam device LD1 above a rear surface of the work panel WP and irradiating the laser beam to the first cutting line CL1 corresponding to the first area AA1. The rear surface of the work panel WP may be defined as a surface opposite to the front surface that provides the display surface IS (refer to FIG. 1) of the display module DM. Under the first condition, the laser beam may be irradiated to the work panel WP while moving the laser beam at a relatively slow first speed. According to an embodiment, the first speed may be greater than or equal to about 1 mm/s and less than or equal to about 300 mm/s. For example, the first speed may be greater than or equal to about 50 mm/s and less than or equal to about 300 mm/s.

Generally, the laser beam irradiated on to the display module may generate heat by causing vibrations of surrounding molecules in the material constituting the display module. Accordingly, the bonding states between the molecules are broken, and thus causing a phase change in the material. Consequently, thermal decomposition occurs in the material, and the material is melted or evaporated due to the increase in temperature. Thus, the display module may be properly processed. When the laser beam is irradiated on to the first cutting line CL1 corresponding to the first area AA1 at the first speed that is relatively slow, a portion of the display module may be melted due to an increase in influence by the thermal decomposition around the portion processed by the laser beam. Accordingly, the angle between the carrier film CF and the protective layer PL disposed on the carrier film CF may be reduced, the carrier film CF may be easily detached, and the display panel DM may be prevented from shaking when the carrier film CF is removed.

Referring to FIGS. 10 and 12B, a portion of the non-effective area NAA adjacent to the first area AA1 may be removed by the irradiating of the laser beam under the first condition. As shown in FIG. 12B, after the laser beam is irradiated under the first condition, a first side surface SF1 of the display module DM may be formed in the first area AA1. The first side surface SF1 may include a first sub-side surface SSF1 corresponding to the carrier film CF and a second sub-side surface SSF2 disposed on the first sub-side surface SSF1. The first sub-side surface SSF1 may have a flat shape. The first sub-side surface SSF1 may be aligned substantially parallel to the third direction DR3. The second sub-side surface SSF2 may include the inclined surface ISF inclined at an angle ($\theta_1$) with respect to the first sub-side surface SSF1. According to an embodiment, the angle between the first sub-side surface SSF1 and the inclined surface ISF may be greater than or equal to about 100° and less than or equal to about 150°.

The first sub-side surface SSF1 may include the carrier film CF and the adhesive layer AL. As the first sub-side surface SSF1 has the flat shape, an uppermost end of the side surface of the carrier film CF may coincide with a lowermost end of the side surface of the adhesive layer AL, however, the embodiments are not limited thereto or thereby. The side surface of the carrier film CF of the first sub-side surface SSF1 may have the flat shape, and the side surface of the adhesive layer AL may be defined inside of the side surface of the carrier film CF. For example, the side surface of the adhesive layer AL may be disposed inside of the side surface of the carrier film CF and may be disposed inside of the side surface of the first protective portion PL1 when viewed in a cross-section. Accordingly, the side surface of the adhesive layer AL may have a recessed shape with respect to the side surface of the carrier film CF and the side surface of the first protective portion PL1.

The second sub-side surface SSF2 may include the inclined surface ISF. The inclined surface ISF may be formed in the first protective portion PL1 disposed on the carrier film CF. The inclined surface ISF may be the curved surface with a curvature. The inclined surface ISF may have the curved shape, and the angle between the inclined surface ISF and the first sub-side surface SSF1 may increase as the distance from the edge of the display module DM decreases. For example, the inclined surface ISF may have the curved shape in which the slope of the tangent line increases as a distance from the edge of the display module DM decreases. The slope of the tangent line may gradually increase in a portion of the inclined surface ISF adjacent to the lower surface of the first protective portion PL1, and the slope of the tangent line may increase sharply in a portion of the inclined surface ISF adjacent to the upper surface of the first protective portion PL1. According to an embodiment, an angle ($\theta_{1a}$) between the lower surface of the first protective portion PL1 and the inclined surface ISF may be greater than or equal to about 10° and less than or equal to about 60°.

In the second sub-side surface SSF2, the side surfaces except the side surface of the first protective portion PL1 may include a flat surface. For instance, the side surfaces of the first adhesive layer AL1, the display panel DP, the second adhesive layer AL2, the anti-reflective layer RPL, the third adhesive layer AL3, the window WL, the window adhesive layer WAL, and the window protective layer WPL may be aligned substantially parallel to the third direction DR3.

Referring to FIGS. 10 and 13A, the manufacturing method of the display device according to an embodiment may include cutting the work panel WP along the second cutting line CL2 corresponding to the second area AA2 of the display module DM. A second process in which the laser beam with second settings (or condition) may be irradiated along the second cutting line CL2, corresponding to the second area AA2, may be performed. The second process may be performed using a second laser beam device LD2. The irradiating of the laser beam with second settings (or condition) may include disposing the second laser beam device LD2 above the rear surface of the work panel WP and irradiating the laser beam on to the second cutting line CL2 corresponding to the second area AA2. Under the second settings (or condition), the laser beam may be irradiated on to the work panel WP while moving the laser beam at the second speed, which is faster than the first speed.

According to an embodiment, the second speed may be greater than or equal to about 400 mm/s and less than or equal to about 1000 mm/s. The second speed may be greater than or equal to about 500 mm/s and less than or equal to about 1000 mm/s. In a case where the second speed satisfies the above-mentioned range, the laser irradiation time may be shorter than a heat conduction time of the display module, and a laser ablation may occur before the display module conducts heat. Thus, melting or cracking of the display module due to the heat may be reduced, and the display module may be processed finely and precisely. In case that the second speed is less than about 400 mm/s, a portion of the display module DM may melt due to the influence of the increased heat on the processed portion corresponding to the second area AA2. In case that the second speed is greater than or equal to about 1000 mm/s, a portion of the carrier film CF may not be removed from the display module DM in the second area AA2, and thus, the carrier film CF may not be completely detached from the display module DM during the detachment process.

Referring to FIGS. 10 and 13B, the non-effective area NAA adjacent to the second area AA2 may be removed by the irradiating of the laser beam under the second settings (or condition). Accordingly, a second side surface SF2 of the work panel WP may be formed in the second area AA2. The second side surface SF2 may include a third sub-side surface SSF3 that overlaps the carrier film CF and a fourth sub-side surface SSF4 that overlaps the display panel DP. Each of the third sub-side surface SSF3 and the fourth sub-side surface SSF4 may have a flat shape. Each of the third sub-side surface SSF3 and the fourth sub-side surface SSF4 may be aligned substantially parallel to the third direction DR3. However, the shape of each of the third sub-side surface SSF3 and the fourth sub-side surface SSF4 is not limited thereto or thereby. For example, the fourth sub-side surface SSF4 may be inclined at an angle ($\theta_2$) with respect to the third sub-side surface SSF3. According to an embodiment, an angle between the third sub-side surface SSF3 and the fourth sub-side surface SSF4 may be greater than or equal to about 170° and less than or equal to about 180°.

As shown in FIG. 11, the work panel WP may be cut to correspond to the shape of the display module DM employed in the display device DD by irradiating laser beams under the first setting (or condition) and the second setting (or condition). In the disclosure, the laser beam devices LD1 and LD2 different from each other are used in the first and second laser processes, however, the embodiments are not limited thereto or thereby. The laser beam devices used in the first and second laser processes may be the same device, and driving conditions of the laser beam device used in the first and second laser processes may be set differently.

Referring to FIGS. 10 and 11, the peeling tape PT may be attached to the first area AA1 of the carrier film CF. When the process of attaching the peeling tape PT to the first area AA1 of the carrier film CF is finished, the carrier film CF may be detached from the display module DM with the peeling tape PT. The first area AA1 is an area where the work panel WP is cut by irradiating the laser beam to the first cutting line CL1 under the first setting (or condition). As described above, the first setting (or condition) may be a setting in which a relatively greater amount of thermal diffusion occurs when a laser cutting process is performed on a surface of a material. Accordingly, the heat diffusion may occur in the material of the display module due to high energy, and thus, a portion of the display module may be melted. Consequently, an angle between the carrier film CF and the display module DM may decrease in a cutting surface of the first area AA1, and thus, the carrier film CF may be easily removed from the display module DM.

On the other hand, the second area AA2 is an area where the work panel WP is cut by irradiating the laser beam on to the second cutting line CL2 under the second setting (or condition), which is different from the first setting. Since peeling tape PT is not attached to the second area AA2, a setting (or condition) for the laser that may reduce thermal diffusion during the laser cutting process is used, and the cutting process may be performed by laser ablation. Accordingly, the laser ablation under the second condition may cause an immediate phase change from a solid state to a gaseous state because a time for a phase change process is very short. Accordingly, the area to which the laser beam is irradiated may be clearly removed in the second area AA2 with no thermal influences on the material for the display module.

According to an embodiment, at least one of a speed, a power, a frequency, and a pulse width of the laser beam in the first setting (or condition) may be different from that in the second setting (or condition). In the disclosure, the difference between the first condition and the second condition is explained by referring to the difference in the speed of the laser beam between the first setting (or condition) and the second setting (or condition), however, the embodiments are not limited thereto or thereby. As described above, the first condition and the second condition may be changed in various ways as long as the conditions may make a time difference in the phase change between the display module material in the first area AA1 and the display module material in the second area AA2 when the laser process is performed. For example, the power of the laser beam may be within a range greater than or equal to about 5 W and less than or equal to about 30 W, the frequency of the laser beam may be within a range greater than or equal to about 200 kHz and less than or equal to about 1600 kHz, and the pulse width may be within a range greater than or equal to about 400 fs and less than or equal to about 100 ps, however, these are merely example values. The power, the processing speed, the frequency, and the pulse width of the laser beam are not limited thereto or thereby.

Figure 14A:
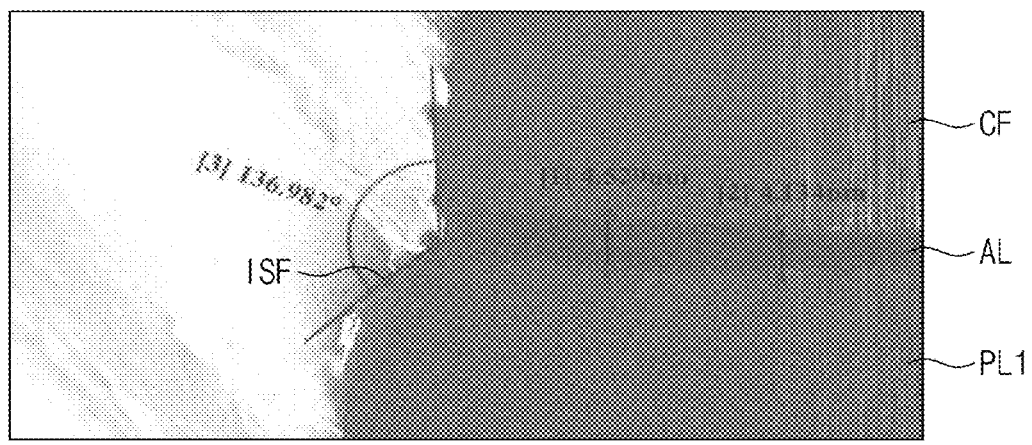
FIGS. 14A and 14B are SEM images showing cross-sectional views of work panels according to an embodiment of the disclosure.
Figure 14B:
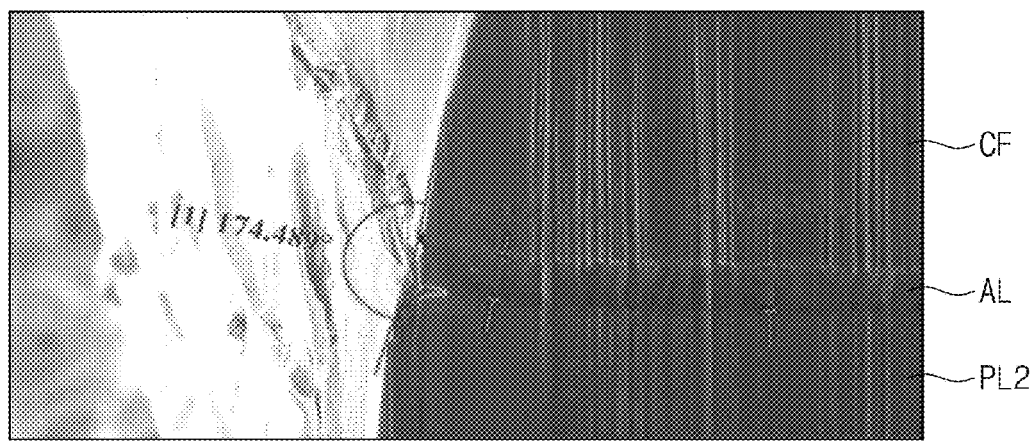

FIGS. 14A and 14B are SEM images showing cross-sectional views of work panels according to an embodiment of the disclosure. FIG. 14A shows the SEM image of the side surface corresponding to the first area in the work panel, and FIG. 14B shows the SEM image of the side surface corresponding to the second area in the work panel. FIG. 14A shows the work panel after the laser beam is irradiated along the first cutting line corresponding to the first area of the carrier film under the first condition, and FIG. 14B shows the work panel after the laser beam is irradiated along the second cutting line corresponding to the second area of the carrier film under the second condition. FIGS. 14A and 14B show the work panels WP rotated 180° such that the carrier film CF faces upward.

Referring to FIG. 14A, the portion of the work panel, which corresponds to the first area, includes the carrier film CF, the adhesive layer AL, and the first protective portion PL1, and it is observed that the inclined surface ISF inclined at an angle with respect to the carrier film CF is formed on the side surface of the first protective portion PL1. As described above, the laser beam irradiated to cut the work panel WP (refer to FIG. 10) along the first cutting line CL1 (refer to FIG. 10) corresponding to the first area AA1 (refer to FIG. 10) is irradiated at the first speed that is relatively slow, and thus, the portion of the layer disposed on the carrier film CF may be thermally processed and melted. Accordingly, since the angle between the side surface of the carrier film CF and the side surface of the first protective portion PL1 disposed on the carrier film CF may decrease, the carrier film CF may be easily detached.

Referring to FIG. 14B, the portion of the work panel, which corresponds to the second area, includes the carrier film CF, the adhesive layer AL, and the second protective portion PL2 of the protective layer PL, and it is observed that the angle between the side surface of the carrier film CF and the side surface of the second protective portion PL2 is greater than the angle between the side surface of the carrier film CF and the side surface of the first protective portion PL1 shown in FIG. 14A. The laser beam irradiated to cut the work panel WP along the second cutting line CL2 (refer to FIG. 10) corresponding to the second area AA2 (refer to FIG. 10) is irradiated at the second speed faster than the first speed. Accordingly, since only laser ablation, which causes the immediate phase change from the solid state to the gaseous state, is applied to the processing portion without the thermal influences on the periphery, the display module DM is prevented from melting.

According to the manufacturing method of the display device, the processing speed may be relatively slow in the first area where the peeling tape is attached during the laser processing operation, and thus, the thermal influences on the processing portion on which the laser processing operation is performed may increase. Accordingly, the angle (when viewed in a cross-section) between the carrier film and the layer disposed on the carrier film may decrease, and the carrier film may be effectively removed, thereby reducing product defects that occur when the carrier film is detached. Further, as the processing speed of the laser beam may be faster in the second area where no peeling tape is attached, damage to the periphery of the processing portion, which may be caused by thermal influences, may be reduced. As a result, burrs or cracks may be prevented from being generated around the processing portion, and thus, the reliability of the display device may be improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A method of manufacturing a display device, comprising:
    providing a work panel comprising a display panel including a folding area and a carrier film disposed under the display panel and including a first area and a second area, wherein a peeling tape is attached to the first area, and the second area is adjacent to the first area; and
    cutting the work panel by irradiating a laser beam on to the work panel, the cutting of the work panel comprising:
    irradiating the laser beam along a first cutting line corresponding to the first area under a first condition; and
    irradiating the laser beam along a second cutting line corresponding to the second area under a second condition, the second condition being different from the first condition.

2. The method of claim 1, wherein the first condition is different from the second condition in at least one of a speed, a power, a frequency, and a pulse width of the laser beam.

3. The method of claim 1, wherein
    the laser beam is irradiated at a first speed under the first condition, and
    the laser beam is irradiated at a second speed faster than the first speed under the second condition.

4. The method of claim 3, wherein the first speed is equal to or greater than about 1 mm/s and equal to or less than about 300 mm/s.

5. The method of claim 1, wherein the cutting of the work panel comprises irradiating the laser beam along the first cutting line and the second cutting line above a rear surface of the work panel.

6. The method of claim 1, further comprising, after the cutting of the work panel:
    attaching the peeling tape to the first area; and
    removing the carrier film from the display panel.

7. The method of claim 1, wherein the first cutting line has a length equal to or greater than about 1.0 cm and equal to or less than about 1.5 cm.

8. The method of claim 1, wherein
    a first side surface is formed in the work panel by the irradiating of the laser beam under the first condition,
    the first side surface comprises:
    a first sub-side surface corresponding to the carrier film; and a second sub-side surface disposed on the first sub-side surface, and
    the second sub-side surface includes an inclined surface inclined at an angle with respect to the first sub-side surface.

9. The method of claim 8, wherein the angle between the first sub-side surface and the inclined surface is equal to or greater than about 100° and equal to or less than about 150°.

10. The method of claim 8, wherein the inclined surface is a convex inclined surface protruded from the first side surface.

11. The method of claim 1, wherein
    a second side surface is formed in the work panel by the irradiating of the laser beam under the second condition,
    the second side surface comprises:
    a third sub-side surface overlapping the carrier film; and
    a fourth sub-side surface overlapping the display panel, and
    an angle between the third sub-side surface and the fourth sub-side surface is equal to or greater than about 170° and equal to or less than about 180°.

12. A method of manufacturing a display device, comprising:
    providing a work panel comprising a display panel including a folding area and a carrier film disposed under the display panel and including a first area and a second area, wherein a peeling tape is attached to the first area, and the second area is adjacent to the first area; and
    cutting the work panel by irradiating a laser beam on to the work panel, the cutting of the work panel comprising:
    irradiating the laser beam along a first cutting line corresponding to the first area under a first condition to form a first side surface in the work panel; and
    irradiating the laser beam along a second cutting line corresponding to the second area under a second condition different from the first condition,
    wherein the first side surface comprises:
    a first sub-side surface corresponding to the carrier film and including a flat surface;
    and a second sub-side surface including an inclined surface adjacent to the first sub-side surface and inclined at a first angle with respect to the flat surface.

13. The method of claim 12, wherein the first condition is different from the second condition in at least one of a speed, a power, a frequency, and a pulse width of the laser beam.

14. The method of claim 12, wherein
the laser beam is irradiated at a first speed under the first condition, and
the laser beam is irradiated at a second speed faster than the first speed under the second condition.

15. The method of claim 12, wherein the first angle is equal to or greater than about 100° and equal to or less than about 150°.

\* \* \* \* \*